United States Patent [19]

Glukhikh et al.

[11] 4,286,166
[45] Aug. 25, 1981

[54] DEVICE FOR ELECTRON IRRADIATION OF ROLLED MATERIALS

[76] Inventors: Vasily A. Glukhikh, Belgradskaya ulitsa, 10, korpus 1, kv. 5; Mikhail P. Sviniin, ulitsa Bogaichuka, 4, kv. 25; Mikhail T. Fedotov, ulitsa Polevaya, 22, kv. 58, all of Leningrad; Vladimir P. Shirokov, ulitsa B. Dekabrskaya, 1, kv. 21; Konstantin D. Pismannik, ulitsa Butlerova, 4, korpus 3, kv. 120, both of Moscow; Alexandr I. Schegolev, ulitsa Pochtovaya, 5, kv. 17, Ivanovo, all of U.S.S.R.; Adolf Heger, Zamenhofstrasse, 9, wohnung 404, Drezden, German Democratic Rep.; Rudolf Hanke, Rufsenbergstrasse, 7, Drezden, German Democratic Rep.; Helmar Pässler, Am. Angerstrasse, 2, Drezden, German Democratic Rep.

[21] Appl. No.: 73,376

[22] Filed: Sep. 7, 1979

[30] Foreign Application Priority Data

Sep. 7, 1978 [SU] U.S.S.R. ............................ 2663351

[51] Int. Cl.$^3$ ..................... H01J 37/30; H01T 19/04
[52] U.S. Cl. ................................. 250/492 B; 250/325
[58] Field of Search ............. 250/492 B, 492 R, 453, 250/324, 325; 361/225; 204/159.14, 159.20; 219/121 EB, 121 EM

[56] References Cited

U.S. PATENT DOCUMENTS

| 2,814,727 | 11/1957 | Gund et al. | 250/492 B |
| 4,152,747 | 5/1979 | Fisher | 250/325 |

FOREIGN PATENT DOCUMENTS

467526  4/1975  U.S.S.R.

OTHER PUBLICATIONS

"Low Energy Electron Process Applications", Nablo et al., *Radiat. Phys. Chem.*, vol. 9, No. 1-3, 1977.
"Radiation and Chemical Plants Employing Electron Acc.", Kozlou et al., *Performance Predictions and Designing of Radiation and Chemical Plants Employing Electron Acc.*, chapter 9, 1976.

*Primary Examiner*—Bruce C. Anderson
*Attorney, Agent, or Firm*—Lackenbach, Lilling & Siegel

[57] ABSTRACT

A device for electron irradiation of rolled materials comprises an electron source arranged in a radiation protection chamber, and a drum for transportation of rolled material in a slotted irradiation zone, defined by the radiation protection chamber wall on one side and by a housing wall on the other side. The drum is made as a cylinder arranged on rims so that a part of said cylinder is located in the irradiation zone between the radiation protection chamber wall and the housing wall.

4 Claims, 2 Drawing Figures

DEVICE FOR ELECTRON IRRADIATION OF ROLLED MATERIALS

FIELD OF THE INVENTION

The invention relates to industrial installations for radiation and chemical treatment of materials and objects and, in particular, to devices for electron irradiation of rolled materials.

The proposed device for electron irradiation of rolled materials, such as textile materials, polymer films, and paper, can be successfully employed in various branches of industry. In textile industry, for example, they are used for local irradiation of fabrics followed by application of a pattern, in order to impart antimicrobic properties thereto or to produce coatings thereon, for example, in manufacturing artificial leather. Such a device is also employed in chemical industry for processing polymer films in order to impart new physical and chemical properties thereto.

DESCRIPTION OF THE PRIOR ART

Such devices require electron sources with a power of up to several hundreds keV which are a potential radiation hazard for personnel. Proper radiation protection is to be provided where such equipment is used. Electron irradiation of rolled materials is, as a rule, performed as the material is continuously fed into the radiation zone. The means for transportation of materials into the radiation zone, provided with proper radiation protection, are often complex and bulky.

There is known a device for electron irradiation of rolled materials (cf., S. V. Nablo and E. P. Tripp. Low Energy Electron Process Applications. Radiation, Physical Chemistry, 1977, Vol. 9, pp. 325-352, Pergamon Press, Printed in Great Britain), which is employed in textile and paper industry for complete irradiation. This device comprises an electron source arranged in a radiation protection chamber and a mechanism for transportation of material into the radiation zone, which essentially consists of a system of drawing and directing rollers. The guiding rollers are arranged inside the radiation protection chamber whereas the drawing rollers are placed outside this chamber. The demand for adequate protection against radiation penetrating through slots for feeding the material in and out of the radiation zone preconditions a great length of the chamber in the direction of movement of the rolled material.

Such a design of the mechanism for transportation of material in the radiation zone makes the device bulky as a whole.

There is also known a device for electron irradiation of rolled materials (cf., for example, USSR Patent No. 467,526 filed Dec. 2, 1972, Class DO6C, 29/00, Published Apr. 15, 1975.), which is employed for processing of textile materials by local irradiation through templets, for example, for application of a pattern. The device comprises an electron source arranged in a radiation protection chamber, a mechanism for transportation of the rolled material in the radiation zone and a mechanism for transportation of a templet in the radiation zone, which is made as a belt-template fit on guide rollers. The movement of the material and the template is closely matched by means of transportation mechanisms.

The presence of two independent transportation mechanisms for the material and the template complicates the design of the device, and makes the device bulkier and the radiation protection more complex.

There is known a device for electron irradiation of rolled materials (cf., for example, Y. D. Kozlov, K. I. Nikulin, Y. S. Titkov, Radiation and Chemical Plants Employing Electron Accelerators, Moscow, Atomizdat, 1976, pp. 151-154, in Russian) featuring a simpler and more compact mechanism for transportation of rolled material in the radiation zone.

This device comprises an electron source placed in a radiation protection chamber provided with a slot as an outlet for electrons into a slotted zone of irradiation of rolled material, which is restricted by radiation protection and formed on one side by the wall of the radiation protection chamber, whose external surface is equidistant to the lateral surface of a drum arranged so it can rotate and guide the rolled material in the radiation zone, said material being pressed against the side surface of the drum by means of rollers.

The irradiation zone on the other side is restricted by a portion of the side surface of the drum whose walls are made thick. The drum is kinematically connected to a motor setting it into rotation. The material is continuously fed into the irradiation zone due to friction between the material and the side surface of the drum, produced by the rollers. The thickness of the drum is selected so as to ensure reliable protection of personnel against radiation. This complicates the design of the mechanism for feeding the material into the irradiation zone. The great weight of the drum requires a powerful drive means, as well as a strong structure to support the drum.

SUMMARY OF THE INVENTION

It is an object of the invention to provide a device for electron irradiation of rolled materials featuring a simplified mechanism for transportation of rolled material in the radiation zone.

Another object of the invention is to provide a device for electron irradiation of rolled materials for local irradiation through templates, featuring a simplified mechanism for transportation of the template.

One more object of the invention is to reduce the dimensions of the proposed device.

Among other objects are improvement of quality of local irradiation of rolled material, as well as simple servicing.

These objects are attained by a device for electron irradiation of rolled materials, comprising an electron source placed in a radiation protection chamber and provided with a slot for letting electrons into a slotted zone for irradiation of rolled material. The slotted zone is defined on one side by a drum and on the other side by a wall of the radiation protection chamber. The surface of the wall of the radiation protection chamber is equidistant to the side surface of the drum which is arranged so it can rotate and guide in the radiation zone the rolled material pressed to the side surface of the drum by means of rollers. According to the invention, the radiation protection of the radiation zone comprises a housing whose inner surface is equidistant to the side surface of the drum and which is rigidly secured to restrict the radiation zone on the other side. The drum is composed of a cylinder fitted on rims, whose portion is situated between the wall of the radiation chamber and the housing.

It is advisable that in order to effect local radiation in a device for electron irradiation of rolled materials, according to the invention, the radiation protection chamber holding an electron source be placed inside the cylinder of the drum and the housing is placed outside this cylinder, the cylinder being provided with openings whose shape corresponds to a specific shape of portions of the rolled material to be irradiated.

It is desirable that the proposed device, according to the invention, comprises a drive means, which is kinematically connected to one of the rims of the drum.

It is profitable that the cylinder, according to the invention, be secured on rims by means of detachable joints.

Such design of the mechanism for transportation of rolled material in the radiation zone permits significant simplification of the overall design of the device and makes it more compact.

The radiation protection chamber and the radiation source being placed inside the cylinder of the drum substantially simplifies the device for local irradiation, since the cylinder of the drum is at same time the means for transportation of the material and the template carrier.

Besides, such arrangement of the device permits appreciable reduction of the dimensions of the device.

The quality of irradiation in the proposed device is also better since the template and the irradiated material move at the same speed and this insures higher precision in further technological operations, for example, pattern application.

As the cylinder is secured on rims by means of detachable joints, the device can be quickly readjusted by simply changing the template.

BRIEF DESCRIPTION OF DRAWINGS

The invention will now be described in greater detail with reference to a specific embodiment thereof, taken in conjunction with the accompanying drawings, wherein.

DETAILED DESCRIPTION OF THE INVENTION

The proposed device for electron irradiation of rolled materials comprises an electron source 1 (FIG. 1) made according to one of the known layouts (cf., for example, S. V. Nablo and E. P. Tripp, Low Energy Electron Process Applications. Radiation Physical Chemistry, 1977, Vol. 9, Pergamon Press, Printed in Great Britain).

Figure 1:
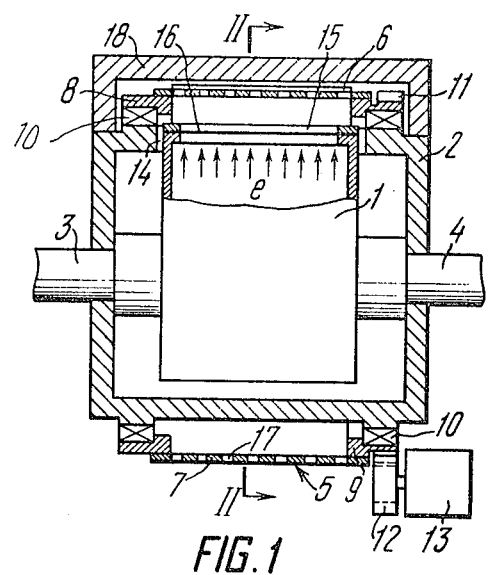
FIG. 1 illustrates a cut-away, sectional longitudinal view of a device for electron irradiation of rolled materials, according to the invention.

The direction of movement of electrons, e, in FIG. 1 is indicated by arrows.

The electron source 1 is mounted on supports (not shown in FIG. 1) in a radiation protection chamber 2. The radiation protection chamber 2 is made of metal, for example, steel. The thickness of the walls of the radiation protection chamber 2 is selected such that reliable protection against radiation is insured. The choice of material for protection against radiation is basically dependent upon the layout requirements.

The chamber 2 features two openings on both sides and along the axis thereof. One opening holds a tube 3 for the high voltage lead-in (not shown in the drawings) to the electron source 1. The other opening holds a tube 4 connecting the inside space of the electron source 1 to a vacuum pump (not shown).

The proposed device also comprises a drum 5 intended for transportation of rolled material 6, in particular some textile material, into the irradiation zone. The drum 5 comprises a metal cylinder 7 secured on rims 8 and 9 by means of detachable joints which in this embodiment are threaded joints. The rims 8 and 9 of the drum 5 are each mounted on bearings 10.

For complete irradiation of the rolled material 6 the chamber 2 is placed outside the cylinder 7 of the drum 5 (such arrangement is known and is not shown in the drawings).

For local irradiation the chamber 2 with the electron source 1 is placed inside the drum 5 and this significantly reduces the overall dimensions of the proposed device. In this case the chamber 2 is cylindrical in shape and the bearings 10 are fitted on the external surface thereof. In this embodiment the drum 5 serves as a drive. To this end the drum 5 is connected to a motor 13 via a gear train comprising meshed gears 11 and 12. In another embodiment of the proposed device the rolled material 6 is transported by means of drawing rollers (not shown). The gear 11 is preferrably made integral with the rim 9.

The chamber 2 is provided with a slot 14 intended for the electrons to pass into the radiation zone restricted by the radiation protection and made in front of an outlet port 15 of the source 1, shut off by a foil 16.

For local irradiation of the rolled material 6, the cylinder 7 is provided with openings 17 made in conformity with a pattern so that their shape corresponds to a specific shape of irradiated portions, that is, the cylinder 7 serves as the template carrier.

The radiation zone is restricted on one side by the cylindrical wall of the radiation protection chamber 2 and on the other side by the cylindrical surface of a housing 18 secured on the external surface of the chamber 2 on the opposite side of the cylinder 7 in front of the slot 14 by means of, for example, a threaded joint. In this case the irradiation zone is in fact the gap between the cylindrical surfaces of the housing 18 and the chamber 2, whose length in the direction of movement of the rolled material 6 is chosen to be sufficient for reduction of radiation by multiple reflection.

The housing 18 is as long as the chamber 2 and is made of the same material as the chamber 2.

Figure 2:
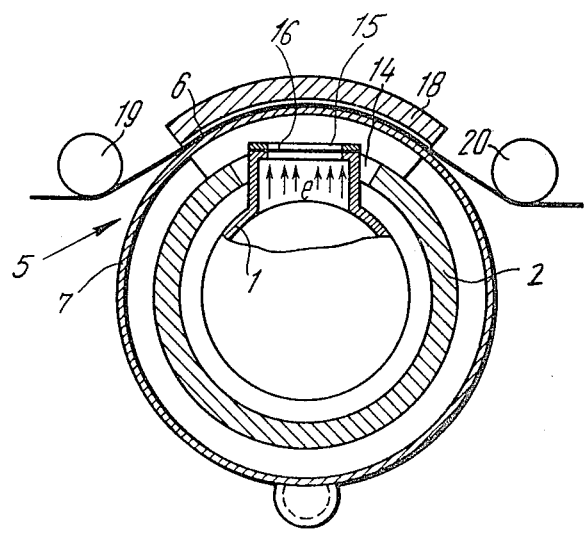
FIG. 2 is a cross-sectional view taken along the line II—II of FIG. 1, according to the invention.

Transportation of the material 6 in the irradiation zone is effected due to friction between the material 6 and the side surface of the cylinder 7 of the drum 5. For this purpose the proposed device comprises rollers 19 (FIG. 2) and 20 arranged on both sides of the irradiation zone to press the material 6 against the cylinder 7 and to ensure free entry of the material 6 into the irradiation zone and exit therefrom.

The device for electron irradiation of rolled materials operates as follows.

As the device is turned on, the motor 13 (FIG. 1) sets into rotation the drum 5 through by means of the gears 11 and 12. The material 6 (FIGS. 1 and 2) is pressed by the rollers 19 and 20 (FIG. 2) to the cylinder 7 of the drum 5 so that there is a close fit of said material 6 to said cylinder 7 in the irradiation zone. The cylinder 7 rotates and, due to friction forces, transports without slippage the material 6 in the irradiation zone.

Portions of the rolled material 6 coming under the outlet port 15 of the electron source 1, operating in accordance with a specific technological process, are irradiated by a flow of electrons to match the shape of the openings 17 made in the cylinder 7. In this manner the drum 5 continuously transports the rolled material 6 in the irradiation zone. The cylinder 7 serves as the template carrier and thus the shape of irradiated portions and the shape of openings 17 in the cylinder 7 are matched.

What is claimed is:

1. A device for electron irradiation of rolled materials, comprising:
    an electron source;
    a radiation protection chamber in which said electron source is positioned, electrons emitted from said electron source passing through a slot in said radiation protection chamber;
    a rotatable drum in which said radiation protection chamber is positioned, said drum transporting said rolled materials into a zone of electron irradiation, and an outer surface of said drum having at least one opening through which electrons may pass to strike said rolled materials;
    a housing mounted on an external surface of said drum to define said zone of electron irradiation between an end wall of said radiation protection chamber and an internal surface of said housing; and
    rollers positioned on both sides of said zone of irradiation and pressing said rolled material against said drum for free entry to and exit from said zone of irradiation.

2. A device according to claim 1, wherein said drum is cylindrical and is rotated by a motor by means of a gear train.

3. A device according to claim 2, wherein said drum is secured on rims by detachable joints, said rims being mounted on bearings.

4. A device according to claim 1, wherein said drum has a plurality of openings forming a pattern so a desired shape of irriadiated portions can be effected.

* * * * *